United States Patent [19]
Pope

[11] Patent Number: 5,982,243
[45] Date of Patent: Nov. 9, 1999

[54] OSCILLATOR SELECTIVELY OPERABLE WITH A PARALLEL TUNED OR A SERIES TUNED RESONANT CIRCUIT

[75] Inventor: Matthew D. Pope, Aurora, Colo.

[73] Assignee: Vari-L Company, Inc., Denver, Colo.

[21] Appl. No.: 09/305,190

[22] Filed: May 4, 1999

Related U.S. Application Data

[60] Provisional application No. 60/084,256, May 5, 1998.

[51] Int. Cl.[6] .................................................. H03B 5/12
[52] U.S. Cl. .......................... 331/59; 331/117 R; 331/179; 331/177 V
[58] Field of Search .......................... 331/59, 60, 117 R, 331/117 FE, 117 D, 177 R, 179, 177 V

[56] References Cited

U.S. PATENT DOCUMENTS

| | | | |
|---|---|---|---|
| 3,105,204 | 9/1963 | Weiler | 331/59 |
| 4,649,354 | 3/1987 | Khanna | 331/179 |
| 5,856,763 | 1/1999 | Reeser et al. | |

*Primary Examiner*—Siegfried H. Grimm
*Attorney, Agent, or Firm*—Ancel W. Lewis, Jr.

[57] ABSTRACT

An electronic oscillator of the Colpitts type with an amplifying element and a tank circuit. The tank circuit includes a parallel tuned resonant circuit, a series tuned resonant circuit and a switching circuit that selectively connects one of the resonant circuits to the tank circuit. The oscillator operates at a first frequency in the parallel tuned mode and a second frequency that is substantially twice the first frequency in the series tuned mode.

6 Claims, 1 Drawing Sheet

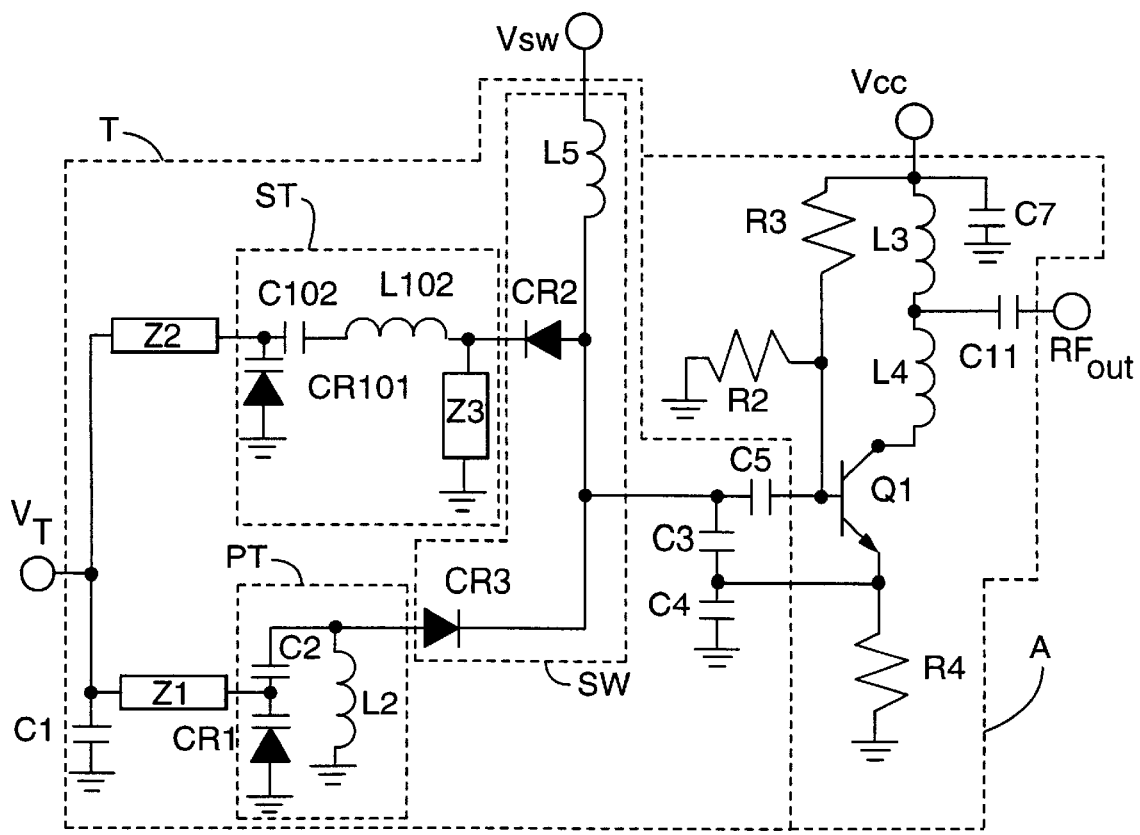

OSCILLATOR SELECTIVELY OPERABLE WITH A PARALLEL TUNED OR A SERIES TUNED RESONANT CIRCUIT

This application claims benefit of provisional application Ser. No. 60/084,256 filed May 5, 1998.

TECHNICAL FIELD

This invention relates to electronic oscillators and more particularly to an electronic oscillator switchable between a parallel tuned mode and a series tuned mode.

BACKGROUND ART

There are a great variety of wireless communication systems being used in the world today, such as Global System for Mobile Communication (GSM), Digital Advanced Mobile Phone Service (DAMPS), Personal Handy System (PHS), Personal Communication Services (PCS), Land Mobile Radio (LMR), Special Mobile Radio (SMR) and two way paging to name a few. The consumer would like their phone or pager to reliably work anywhere in the world, with any system architecture without costing them a small fortune. This desire has led mobile equipment manufacturers to offer dual mode and dual band models. Dual mode/band capabilities can accommodate the different modulation and data formatting protocols, as well as accommodate different frequencies required in various parts of the world. These features could allow the consumer to use a single phone in Europe (GSM) and the United States (PCS), a desirable situation in an increasingly smaller world.

Typically, the Voltage Controlled Oscillator (VCO) generates the Local Oscillator (LO) signal for transmit and receive functions in mobile radio RF circuitry. In dual band radios, a single VCO is desired to operate at two different frequencies to meet the requirements of two bands.

Prior art dual band devices have been implemented in the following ways: a single oscillator followed by a multiplier circuit, two separate oscillators with a switching network after the devices to select the appropriate oscillator, extremely wide band oscillators that operate over the entire frequency range, a dual band oscillator with commonly connected emitters in which the bias is changed to turn on a first oscillator at a frequency then to transition to a second frequency as the second desired oscillation frequency, or two completely separate Voltage Controlled Oscillators (VCOs) that are matched then combined using a combiner network such as a Wilkinson Power Divider.

The disadvantage of using a single oscillator with a multiplier circuit following the oscillator is the multiplier circuit requires current to function and the current drain may decrease the battery life of the device when used in a portable application. There are also harmonics of the fundamental frequency generated in addition to the desired frequency and these unwanted spurious signals may be a problem in the system and require extra filtering circuitry which will add cost and complexity.

The disadvantage of using two oscillators with an output switching network is each oscillator must be matched to the reference impedance of the system, typically 50 ohms for RF circuits in this frequency range, then the switching circuit must be implemented again adding complexity and parts to the device.

The disadvantage of using an extremely wide band oscillator is that to accomplish the wide tuning range a large capacitance change is required in the tank circuit. This large capacitance change requires a large voltage change applied to the variable capacitor (a varactor diode) which is unavailable in many applications and the circuit Q is degraded which increases the noise in the circuit rendering the oscillator unable to meet the phase noise requirements of the application.

The disadvantage of using the dual band oscillator with the common coupled emitters is the output is typically taken from a common point between the two collectors or emitters which are coupled. This was disclosed by Reeser et al. in U.S. Pat. No. 5,856,763. This requires a matching network be synthesized to match the transistor output to the reference impedance of the system, again typically 50 ohms at these frequencies. This network may be complex since the network will pass the lower frequency and the higher frequency. Since the higher frequency is approximately twice the first frequency, a wide band output network should be used, and the second harmonic of the lower frequency oscillator will be within the passband and may be passed to the output creating unwanted spurious signal.

The disadvantage of using two different oscillators with a Wilkinson combiner is each individual oscillator must be matched to the reference impedance of the system, again typically 50 ohms in RF circuits, then the Wilkinson combiner is implemented. The Wilkinson combiner will be unbalanced when either oscillator is shut off providing unequal loads on the input of the combiner. This will alter the amplitude response of the combiner. One solution to this dilemma is to provide an amplifier to the output of the oscillator before the combiner. This results in extra current and circuitry requirements.

There are switched resonator designs that switch the a resonating element in the tank circuit to achieve a difference in the operating frequency of the device. This is typically achieved by switching either an extra capacitance into the tank circuit or switching an amount of inductance into the tank circuit. These approaches allow the frequency of the oscillator to be altered by approximately 10 to 40%. The reason for this is the amount the inductance or capacitance in the tank circuit can be altered and have adequate gain to sustain oscillation is limited.

DISCLOSURE OF THE INVENTION

An electronic oscillator having a tank circuit and a signal amplifier circuit is disclosed. The tank circuit is a Colpitts type, and includes a parallel tuned resonant circuit, a series tuned resonant circuit and a switching means that switches on only one of the resonant circuits at one time. The oscillator oscillates in a parallel tuned mode at a first frequency and in a series tuned mode at a second frequency that is approximately twice the first frequency. The oscillator provides the two frequencies with only one amplifying element and with a portion of the tank circuit common to both resonant modes, thereby reducing the complexity and the number of components relative to prior known devices.

BRIEF DESCRIPTION OF THE DRAWINGS

Details of this invention are described in connection with the single drawing figure which is an electronic circuit diagram of a switched mode voltage controlled oscillator.

DETAILED DESCRIPTION OF THE INVENTION

Referring to the drawing, there is shown a voltage controlled oscillator embodying features of this invention which includes a tank circuit T, generally in a Colpitts type configuration, and a signal amplifier circuit A. The tank circuit T includes a parallel tuned resonant circuit PT, a series tuned resonant circuit ST and a means for switching on either the parallel tuned resonant circuit or the series tuned resonant circuit, shown as switching circuit SW. The parallel tuned resonant circuit PT includes a first resonating inductor L2 connected in parallel with a first DC blocking capacitor C2 which is connected in series with a first tuning capacitor CR1, shown as a varactor diode. The parallel tuned resonant circuit PT is parallel tuned because the first tuning capacitor CR1 and the first resonating inductor L2 are in parallel. The side of the first resonating inductor L1 opposite the connection to the first DC blocking capacitor C2 and the side of the first tuning capacitor CR1 opposite the connection to the first DC blocking capacitor C2 are both connected to ground.

A DC voltage tuning input terminal $V_T$ is connected through a first impedance Z1 to the connection of first tuning capacitor CR1 and first DC blocking capacitor C2. A voltage, typically from 0 to 8 volts, is applied to terminal $V_T$ to tune the capacitance of first tuning capacitor CR1. First impedance Z1 is of a high value so as not to load the Q of the parallel tuned tank circuit, and may be an RF choke, a high impedance active device such as a transistor, or another network presenting a high RF impedance and a controlled DC resistance. An RF bypass capacitor C1 is connected to input terminal $V_T$ and to ground to provide a low pass filter and thereby short out any RF signals. Capacitor C1 is a low reactance at minimum oscillator frequencies and a high reactance at maximum anticipated modulation frequencies.

The series tuned resonant circuit ST includes a second tuning capacitor CR101, shown as a varactor diode, a second DC blocking capacitor C102 and a second resonating inductor L102 connected in series. The series tuned resonant circuit ST is series tuned because the second resonating inductor L102 and second tuning capacitor CR101 are in series. The second tuning capacitor CR101 is connected to ground on the side opposite the connection to the second DC blocking capacitor C102. The DC voltage tuning input terminal $V_T$ is connected through a second impedance Z2 to the connection of second tuning capacitor CR101 and second DC blocking capacitor C102. A voltage, typically from 0 to 8 volts, is applied to terminal $V_T$ to tune the capacitance of second tuning capacitor CR101. The second impedance Z2 is of a high value so as not to load the Q of the series tuned tank circuit, and may be an RF choke, a high impedance active device such as a transistor, or another network presenting a high RF impedance and a controlled DC resistance. A third impedance Z3 connects between the side of second resonating inductor L102 opposite second DC blocking capacitor C102 and ground.

The switching circuit SW includes a DC voltage switching input terminal $V_{sw}$ connected through an inductor L5 to the cathode of a first switching diode CR3 and to the anode of a second switching diode CR2. The inductor L5 is an RF choke provided to prevent loading of the oscillating circuit. The anode of the first switching diode CR3 connects to the common connection of first resonating inductor L2 and first DC blocking capacitor C2. The cathode of second switching diode CR2 connects to the side of second resonating inductor L102 opposite second DC blocking capacitor C102. When no voltage is supplied at the switching input terminal $V_{sw}$ the first switching diode CR3 is in a low impedance state and the parallel tuned tank circuit operates to provide oscillation for the voltage controlled oscillator. When a DC voltage equal to or greater than the voltage supplied to the DC voltage supply terminal $V_{cc}$, described below, is supplied at the switching input terminal $V_{sw}$ the first switching diode CR3 is in a high impedance state, the second switching diode CR2 is in a low impedance state, and the voltage controlled oscillator operates in the series tuned mode. The above described switching circuit is described by way of example and not limitation. Alternatively, other means for switching the tank circuit T between the parallel tuned resonant circuit PT and the series tuned resonant circuit ST could be provided, such as a switch or other active component.

The tank circuit T also includes series connected first and second signal divider capacitors C3 and C4, which connect from the common connection of first and second switching diodes CR3 and CR2 to ground. A first side of a capacitor C5 also connects to the common connection of first and second switching diodes CR3 and CR2.

The signal amplifier circuit A for the voltage controlled oscillator includes an amplifying element, shown an NPN transistor Q1. The base of the transistor Q1 is connected to a DC voltage supply terminal $V_{cc}$ through a resistor R3 and to ground through a resistor R2. An RF bypass capacitor C7 connects between the DC voltage supply terminal $V_{cc}$ and ground to provide an RF ground.

The power output is shown as being taken from the collector of the transistor Q1. An AC output coupling and impedance matching arrangement includes series connected inductors L3 and L4 connected between the collector of the transistor Q1 and the DC voltage supply terminal $V_{cc}$, and a power output terminal $RF_{out}$ connected through a capacitor C11 to the connection of inductors L3 and L4. The output coupling and impedance matching can be accomplished in a number of ways to match the active device to the desired output load. A voltage, typically from 0 to 5 volts, is applied to terminal $V_{cc}$.

The feedback loop for sustaining the oscillations in the tank circuits includes the transistor Q1, signal divider capacitor C3, and capacitor C5. The emitter of transistor Q1 connects between signal divider capacitors C3 and C4. The side of the capacitor C5 opposite the connection to first and second switching diodes CR3 and CR2 connects to the base of the transistor Q1. A bias impedance in the form of a resistor R4 is shown connected between the emitter of the transistor Q1 and ground.

By way of example, and not limitation, the table below lists exemplary values for the components of the above described circuit for a frequency of about 800 MHz for the parallel tuned tank circuit and a frequency of about 1900 MHz for the series tuned tank circuit.

| | |
|---|---|
| C2 | 3.3 pF |
| C3 | 2.0 pF |
| C4 | 3.9 pF |
| C5 | 1.0 pF |
| C7 | 33 pF |
| C11 | 33 pF |
| C102 | 2.0 pF |
| CR1 | 19 to 10 pF over 1 to 4 volts |
| CR101 | 6 to 4 pF over 1 to 4 volts |
| L2 | 8 nH |
| L3 | 8 nH |
| L4 | 2 nH |
| L102 | 3 nH |
| R2 | 2 kΩ |
| R3 | 2 kΩ |
| R4 | 200 Ω |
| Vcc | 5 V |

-continued

| | |
|---|---|
| Vsw | 5 V |
| Vt | 0–8 V |

Although the present invention has been described with a certain degree of particularity, it is understood that the present disclosure has been made by way of example and that changes in details of structure may be made without departing from the spirit thereof.

What is claimed is:

1. An electronic oscillator comprising:

a tank circuit including a parallel tuned resonant circuit, a series tuned resonant circuit, and means, coupled to said parallel and series tuned resonant circuits, for switching one of said resonant circuits on while switching the other said resonant circuit off, and an amplifier circuit connected to said tank circuit for sustaining oscillations.

2. The oscillator as set forth in claim 1 wherein said means for switching includes:

a switching voltage terminal, a first diode connected to said switching voltage terminal and to said series tuned resonant circuit, and a second diode connected to said switching voltage terminal and to said parallel tuned resonant circuit.

3. The oscillator as set forth in claim 1 wherein said parallel tuned resonant circuit oscillates at a first frequency and said series tuned resonant circuit oscillates at a second frequency substantially twice said first frequency.

4. The oscillator as set forth in claim 1 wherein said tank circuit is a Colpitts type tank circuit.

5. The oscillator as set forth in claim 4 wherein said series tuned resonant circuit and said parallel tuned resonant circuit have common series connected first and second voltage divider capacitors.

6. A voltage controlled, Colpitts oscillator comprising:

a tank circuit including a parallel tuned resonant circuit, a series tuned resonant circuit, and means, coupled to said parallel and series tuned resonant circuits, for switching one of said resonant circuits on while switching the other said resonant circuit off, said parallel tuned resonant circuit including a first resonating inductor, a first DC blocking capacitor and a first tuning capacitor, said parallel tuned resonant circuit oscillating at a first frequency, said series tuned resonant circuit including a second resonating inductor, a second DC blocking capacitor and a second tuning capacitor, said series tuned resonant circuit oscillating at a second frequency substantially twice said first frequency, said means for switching including a switching voltage terminal, a first diode connected to said switching voltage terminal and to said series tuned resonant circuit, and a second diode connected to said switching voltage terminal and to said parallel tuned resonant circuit, said tank circuit also including common series connected first and second voltage divider capacitors connected to said parallel tuned resonant circuit and to said series tuned resonant circuit, and an amplifier circuit connected to said tank circuit for sustaining oscillations.

* * * * *